(12) United States Patent
Kim

(10) Patent No.: US 9,105,758 B2
(45) Date of Patent: Aug. 11, 2015

(54) SEMICONDUCTOR DEVICE INCLUDING A CAPACITOR

(75) Inventor: Hyun Jung Kim, Seoul (KR)

(73) Assignee: HYNIX SEMICONDUCTOR INC., Icheon (KR)

( * ) Notice: Subject to any disclaimer, the term of this patent is extended or adjusted under 35 U.S.C. 154(b) by 795 days.

(21) Appl. No.: 13/289,231

(22) Filed: Nov. 4, 2011

(65) Prior Publication Data

US 2012/0112349 A1    May 10, 2012

(30) Foreign Application Priority Data

Nov. 4, 2010 (KR) .................. 10-2010-0109369

(51) Int. Cl.
*H01L 49/02* (2006.01)
*H01L 27/108* (2006.01)

(52) U.S. Cl.
CPC .......... *H01L 28/90* (2013.01); *H01L 27/10817* (2013.01); *H01L 27/10855* (2013.01); *H01L 28/75* (2013.01)

(58) Field of Classification Search
CPC ......... H01L 28/90; H01L 28/40; H01L 28/75; H01L 27/1255; H01L 29/66181; H01L 27/10817; H01L 27/10855
See application file for complete search history.

(56) References Cited

U.S. PATENT DOCUMENTS

| | | | |
|---|---|---|---|
| 6,518,130 B1 * | 2/2003 | Ohno .............................. | 438/275 |
| 6,756,262 B1 * | 6/2004 | Nakamura et al. ............ | 438/240 |
| 6,873,002 B2 * | 3/2005 | Nishikawa ..................... | 257/308 |
| 7,026,208 B2 * | 4/2006 | Park et al. ...................... | 438/239 |
| 7,071,071 B2 * | 7/2006 | Iijima et al. .................... | 438/396 |
| 7,442,981 B2 * | 10/2008 | Nam et al. ...................... | 257/303 |
| 7,723,202 B2 * | 5/2010 | Eto ................ | 438/396 |
| 8,188,529 B2 * | 5/2012 | Nakamura et al. ............ | 257/306 |
| 2002/0008270 A1 * | 1/2002 | Marsh ............................ | 257/306 |
| 2003/0178728 A1 * | 9/2003 | Park et al. ...................... | 257/758 |
| 2004/0132246 A1 * | 7/2004 | Kim et al. ...................... | 438/253 |
| 2006/0267062 A1 * | 11/2006 | DeBoer et al. ................ | 257/296 |
| 2008/0239815 A1 * | 10/2008 | Nakamura et al. ....... | 365/185.13 |
| 2009/0179246 A1 * | 7/2009 | Nakamura et al. ............ | 257/298 |
| 2009/0294905 A1 * | 12/2009 | Watanabe ...................... | 257/532 |
| 2010/0244110 A1 * | 9/2010 | Kim et al. ...................... | 257/296 |
| 2011/0001177 A1 * | 1/2011 | Tanaka et al. ................. | 257/306 |
| 2012/0032242 A1 * | 2/2012 | Aoki ............................. | 257/296 |
| 2012/0193757 A1 * | 8/2012 | Shih et al. ..................... | 257/532 |

FOREIGN PATENT DOCUMENTS

| | | |
|---|---|---|
| KR | 1020090032884 A | 4/2009 |
| KR | 1020100035958 A | 4/2010 |
| KR | 1020100047609 A | 5/2010 |

* cited by examiner

*Primary Examiner* — Joseph C Nicely (57) ABSTRACT

A semiconductor device is disclosed, which reduces the depth of a metal contact so that an etching margin is increased in forming a contact hole. In addition, the semiconductor device and the method for forming the same increase a contact area between a plate electrode and a metal contact so that a power source can be more easily provided to the plate electrode. Thus, a sensing noise is reduced and a process margin is improved, resulting in improvement of device operation characteristics.

19 Claims, 8 Drawing Sheets

SEMICONDUCTOR DEVICE INCLUDING A CAPACITOR

CROSS-REFERENCE TO RELATED APPLICATION

The priority of Korean patent application No. 10-2010-0109369 filed on 4 Nov. 2010, the disclosure of which is hereby incorporated in its entirety by reference, is claimed.

BACKGROUND OF THE INVENTION

Embodiments of the present invention relate to a semiconductor device, and more particularly to a semiconductor device including a capacitor.

Cylindrical capacitors have been widely used to increase electrostatic capacitance of a cell capacitor. In this case, a metal contact is formed to apply a necessary power source to a plate electrode acting as an upper electrode. Such a metal contact is generally located at the edge of a cell region. As the height of a capacitor becomes larger to increase electrostatic capacitance of a cell capacitor, the depth of a metal contact becomes deeper. As a result, when forming the metal contact, an etch margin is reduced and a contact area of the metal contact is also reduced, so that the capability of providing a power source to the plate electrode is greatly deteriorated. In order to solve the above-mentioned problem, a method for forming a metal contact in a cell region has recently been proposed.

BRIEF SUMMARY OF THE INVENTION

Various embodiments of the present invention are directed to providing a semiconductor device that substantially obviates one or more problems due to limitations and disadvantages of the related art.

An embodiment of the present invention relates to a semiconductor device and a method forming the same, which can reduce the depth of a metal contact so that an etching margin is increased when forming a contact hole. In addition, the semiconductor device and the method for forming the same increase a contact area between a plate electrode and a metal contact so that a power source can be more easily provided to the plate electrode.

In accordance with an aspect of the present invention, a semiconductor device includes a storage node formed over a semiconductor substrate of a cell region; a first plate electrode formed over the semiconductor substrate of the cell region including the storage node; an insulation film that is formed at outside of the cell region located at a lateral surface of the first plate electrode, and an highest point is lower than an highest point of the first plate electrode; a second plate electrode formed over the insulation film and the first plate electrode; and a contact plug formed to be coupled to the second plate electrode formed over the insulation film.

The storage node may be configured in a cylindrical form. The storage node may include any one of titanium (Ti), titanium nitride (TiN), and a combination thereof. The semiconductor device may further include a dielectric film formed over the semiconductor substrate including the storage node. The first plate electrode may include any one of TiN, WN, TaN, Pt, Ru, W, and a combination thereof. The second plate electrode may include tungsten (W). The semiconductor device may further include a metal line coupled to the contact plug.

In accordance with another aspect of the present invention, a semiconductor device includes a first plate electrode formed over a semiconductor substrate of a cell region; an insulation film formed at a lateral surface of the first plate electrode; a second plate electrode formed over the insulation film and the first plate electrode; and a contact plug coupled to the second plate electrode formed over the insulation film.

The semiconductor device may further include a storage node formed over the semiconductor substrate of the cell region. An highest point of the insulation film is lower than an highest point of the first plate electrode. The storage node may be configured in a cylindrical form.

The storage node may include any one of titanium (Ti), titanium nitride (TiN), and a combination thereof. The semiconductor device may further include a dielectric film formed over the semiconductor substrate including the storage node.

The first plate electrode may include any one of TiN, WN, TaN, Pt, Ru, W, and a combination thereof. The second plate electrode may include any one of TiN, WN, TaN, Pt, Ru, W, and a combination thereof. The semiconductor device may further include a metal line coupled to the contact plug.

In accordance with another aspect of the present invention, a semiconductor device includes a first plate electrode formed over a semiconductor substrate of a cell region; an insulation film formed at a lateral surface of the first plate electrode; a second plate electrode formed over the insulation film and the first plate electrode; and a contact plug coupled to the second plate electrode formed over the insulation film.

The semiconductor device may further include a storage node formed over the semiconductor substrate of the cell region. An highest point of the insulation film may be formed below an highest point of the first plate electrode. The storage node may be configured in a cylindrical form.

The storage node may include any one of titanium (Ti), titanium nitride (TiN), and a combination thereof. The semiconductor device may further include a dielectric film formed over the semiconductor substrate including the storage node. The first plate electrode may include any one of TiN, WN, TaN, Pt, Ru, W, and a combination thereof. The second plate electrode may include any one of TiN, WN, TaN, Pt, Ru, W, and a combination thereof.

The semiconductor device may further include a metal line coupled to the contact plug.

In accordance with another aspect of the present invention, a method for forming a semiconductor device includes forming a storage node over a semiconductor substrate of a cell region, forming a first plate electrode over the semiconductor substrate of the cell region including the storage node, forming a first insulation film exposing an highest point of the first plate electrode at a lateral surface of the first plate electrode formed at the outside of the cell region, forming a second plate electrode over the first insulation film and the first plate electrode, and forming a contact plug to be coupled to the second plate electrode formed over the first insulation film.

In the forming of the storage node over the semiconductor substrate, the storage node may be configured in a cylindrical form, and the storage node may include any one of titanium (Ti), titanium nitride (TiN), and a combination thereof. Prior to forming the first plate electrode over the semiconductor substrate, the method for forming the semiconductor may further include depositing a dielectric film over the semiconductor substrate including the storage node.

The forming of the first plate electrode over the semiconductor substrate of the cell region may include: forming a first plate electrode over the semiconductor substrate including the storage node; forming a mask pattern over the first plate electrode of the cell region; and exposing the semiconductor substrate located at the outside of the cell region by etching the first plate electrode using the mask pattern as an etch mask.

The first plate electrode may include any one of TiN, WN, TaN, Pt, Ru, and a combination thereof. The forming of the first insulation film exposing a highest point of the first plate electrode may further include forming an insulation film over the semiconductor substrate including the first plate electrode; and etching the insulation film through an etch-back process.

In the forming of the second plate electrode, the second plate electrode may be formed of a material including tungsten (W). The forming of the contact plug coupled to the second plate electrode may further include forming a second insulation film over the second plate electrode; forming a contact hole exposing the second plate electrode by etching the second insulation film formed at the outside of the cell region; and burying a conductive material in the contact hole.

After forming the contact plug coupled to the second plate electrode, the method for forming the semiconductor may further include forming a metal line coupled to the contact plug.

It is to be understood that both the foregoing general description and the following detailed description of the present invention are exemplary and explanatory and are intended to provide further explanation of the invention as claimed.

DESCRIPTION OF EMBODIMENTS

Reference will now be made in detail to embodiments of the present invention, examples of which are illustrated in the accompanying drawings. Wherever possible, the same reference numbers will be used throughout the drawings to refer to the same or like parts. A semiconductor device according to embodiments of the present invention will hereinafter be described with reference to the accompanying drawings.

Figure 1:
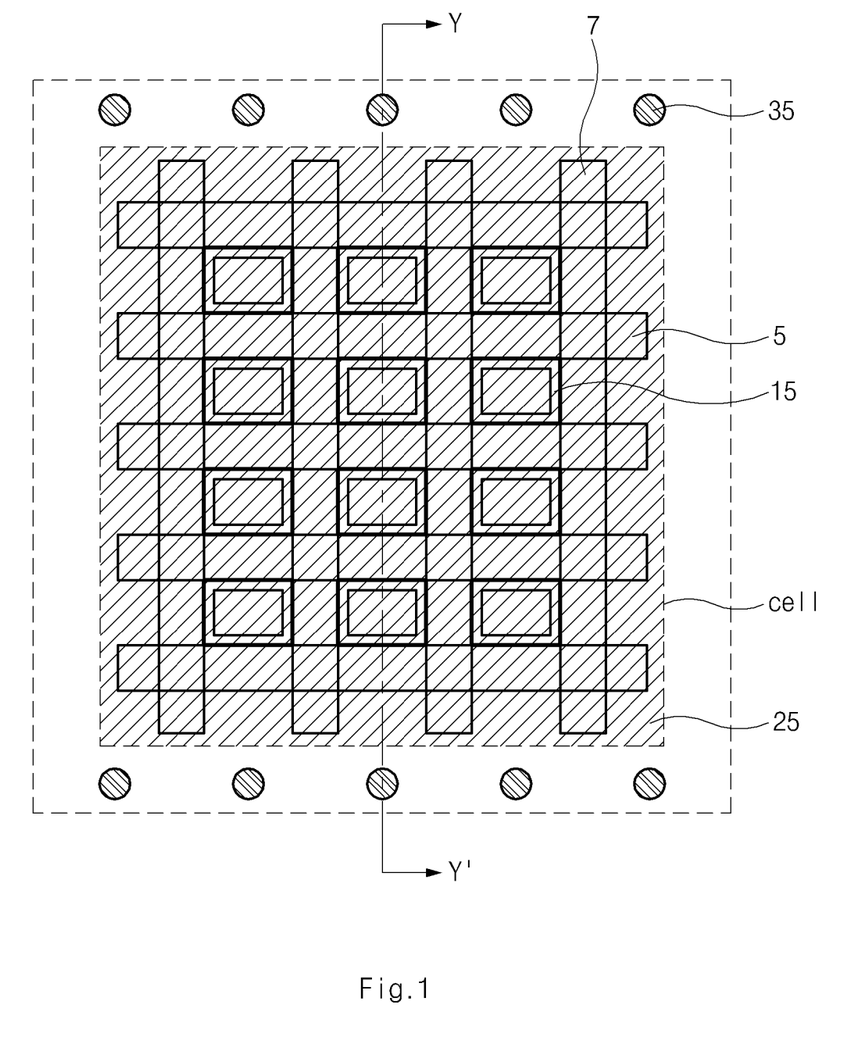
FIG. 1 is a plan view illustrating a semiconductor device including a word line, a bit line, and a metal contact.

FIG. 1 is a plan view illustrating a general cell memory device. Referring to FIG. 1, a line-type word line 5 intersects a bit line 7. A cell capacitor capable of storing data is formed in a cell region. A plate electrode 25 of a cell capacitor covers the entire cell region, and no electrode material exists in the remaining regions other than the cell region. In addition, a contact plug 35 is formed at the outside of the cell region so as to provide a voltage level to the plate electrode 25.

Figure 2:
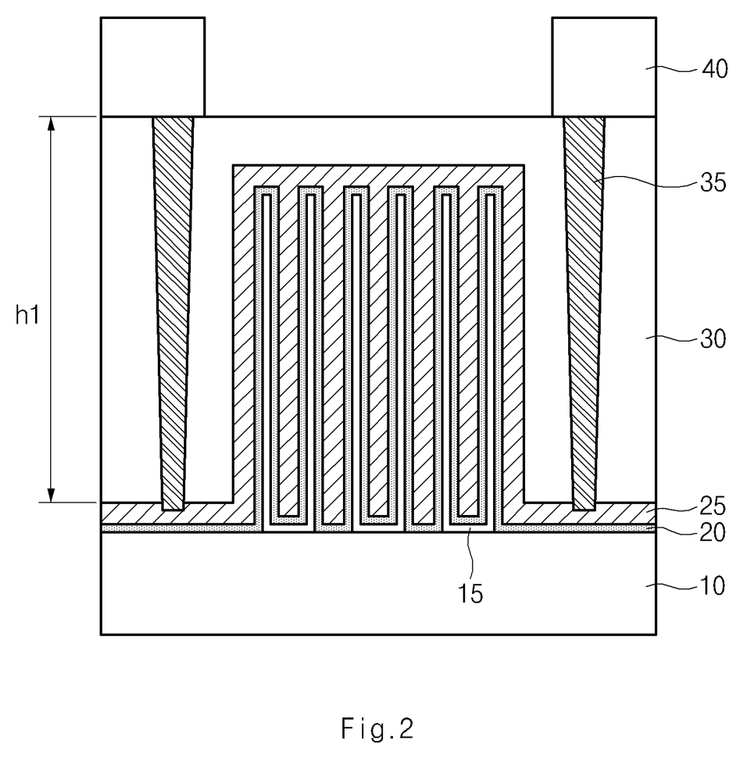
FIGS. 2 and 3 show a semiconductor device including a cylindrical capacitor.
Figure 3:
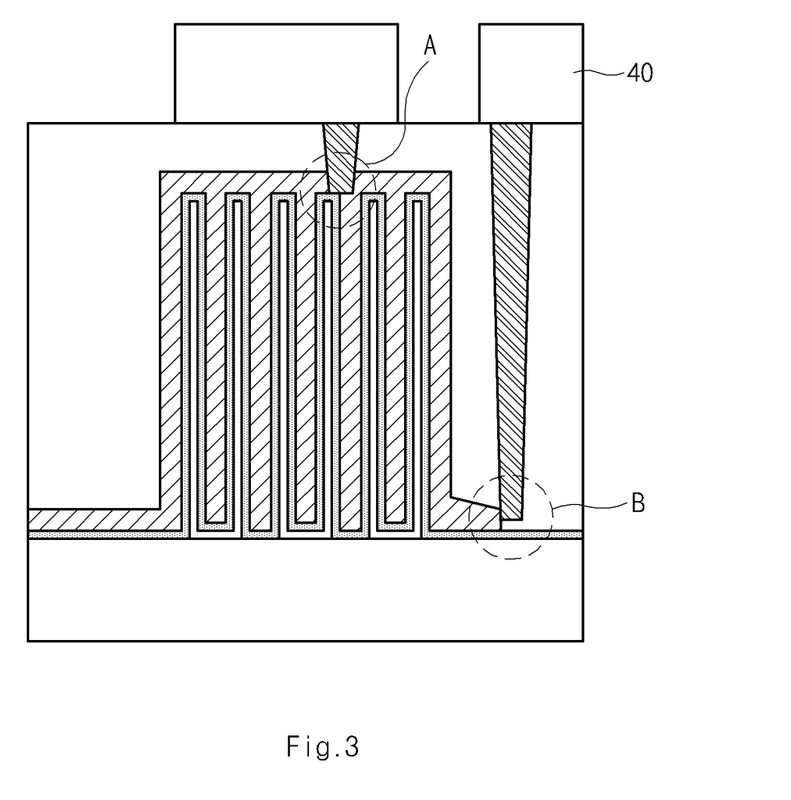

FIGS. 2 and 3 are cross-sectional views illustrating a semiconductor device taken along the line Y-Y' of FIG. 1.

Referring to FIGS. 2 and 3, a storage node 15 coupled to a storage node contact plug (not shown) is formed over a semiconductor substrate 10 including a lower structure equipped with the storage node contact plug. In this case, the storage node 15 is formed only in the cell region. Then, a dielectric film 20 is formed over the semiconductor substrate 10 including the storage node 15. The dielectric film 20 is deposited along the surface of the storage node 15. Subsequently, a plate electrode 25 is formed over the dielectric film 20. In this case, the plate electrode 25 is formed to include all of the storage nodes 15.

After that, a planarized insulation film 30 is formed over the semiconductor substrate 10 including the plate electrode 25. Subsequently, the insulation film 30 formed at the outside of the cell region is etched so that a contact hole exposing the plate electrode 25 is formed. A conductive material is buried in the contact hole so that a contact plug 35 is formed. At this time, as the height of the storage node 15 becomes larger to create higher electrostatic capacitance in the cell capacitor, the depth (h1) of the insulation film 30 to be etched during the formation of the contact hole becomes deeper. Therefore, as a margin required for a contact hole etching process is reduced and an aspect ratio of the contact hole is increased, an etch profile is tilted so that an area of a lower part of the contact plug 35 becomes narrower. In other words, the diameter of the contact hole decreases as the depth of the hole increases so that a contact region between the plate electrode 25 and the contact plug 35 is gradually reduced, and resistance is unavoidably increased. In addition, the higher the resistance, the worse the characteristics of a power source applied to the plate electrode 25, resulting in deterioration of device characteristics.

In order to solve the above-mentioned problem, a method for forming a contact plug to apply a voltage to a plate electrode in a cell region has been proposed as shown in FIG. 3. According to the method, when forming a contact plug in the cell region, a defect formed by a metal contact penetrating a cell capacitor may occur (See the part "A").

In order to prevent a defect caused by a contact plug penetrating a cell capacitor, a plate electrode 25 should be formed to have a sufficient thickness. However, when forming such a thick plate electrode 25, if a contact plug 35 contained in the cell region is set to an etching target, the plate electrode 25 is not fully exposed (See the part "B"), so that the plate electrode 25 may be short-circuited to other-purposed metal contact.

A semiconductor device according to an embodiment of the present invention will hereinafter be described with reference to the attached drawings.

Figure 4:
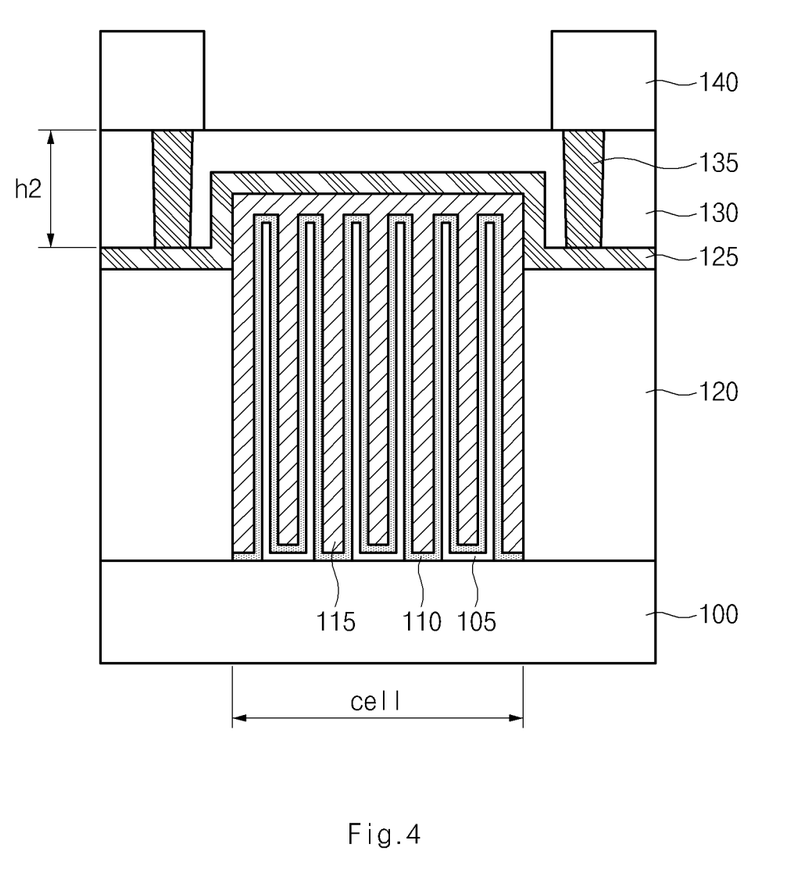
FIG. 4 is a cross-sectional view illustrating a semiconductor device according to an embodiment of the present invention.

FIG. 4 is a cross-sectional view illustrating a semiconductor device according to an embodiment of the present invention.

Referring to FIG. 4, a storage node 105 is formed over a semiconductor substrate 100 of a cell region in which a lower structure including a storage node contact (not shown) is formed. Preferably, the storage node 105 may be configured in a cylindrical form. In addition, a dielectric film 110 is formed over the storage node 105 of the cell region. A dielectric film 110 may include any one of $HfO_2$, $Al_2O_3$ and a combination thereof. A first plate electrode 115 is formed to cover the storage node 105 in which the dielectric film 110 is formed. Preferably, the first plate electrode 115 may be formed only in the cell region. The first plate electrode 115 may include TiN, WN, TaN, Pt, Ru, W, or a combination thereof.

In addition, a first insulation film 120 is formed over sidewalls of the first plate electrode 115, and the first insulation film 120 may be located only outside of the cell region. In this case, the first insulation film 120 may be located below the uppermost surface of the first plate electrode 115. In addition, a second plate electrode 125 may be formed over the first plate electrode 115 and the first insulation film 120. Preferably, the second plate electrode 125 is formed of a low-resistance material. For example, the second plate electrode 125 may include tungsten (W). Preferably, the second plate electrode 125 is coupled to the first plate electrode 115. The second plate electrode 125 contained in the cell region may be located above the second plate electrode 125 located at the outside of the cell region.

In addition, the contact plug 135 is coupled to a portion of the second plate electrode 125 formed outside of the cell region. The contact plug 135 may be contained in a second insulation film 130, and may be formed close to the cell region. In addition, the contact plug 135 may be formed to have a larger critical dimension (CD) than the conventional contact plug 35 shown in FIG. 1, resulting in an increased contact area.

A metal line 140 coupled to the contact plug 135 is formed over the second insulation film 130. The depth (h2) of the contact plug 135 is less than that of the conventional contact plug 35, so that a contact area between the contact plug 135 and the plate electrode is increased. As a result, as resistance of the plate electrode is reduced, voltage-applying characteristics of the plate electrode are improved, resulting in the improvement of device characteristics.

As described above, since the second plate electrode is disposed over the first insulation film located outside of the cell region, the depth of a metal contact is reduced, so that the burden of an etch process may be greatly reduced in forming the contact hole. In addition, since the contact area of the metal contact is enlarged, a power source can be more easily applied to the plate electrode, resulting in improved device operation characteristics.

FIG. 5A to 5G are a cross-sectional views illustrating a method for forming a semiconductor device according to an embodiment of the present invention.

Figure 5A:
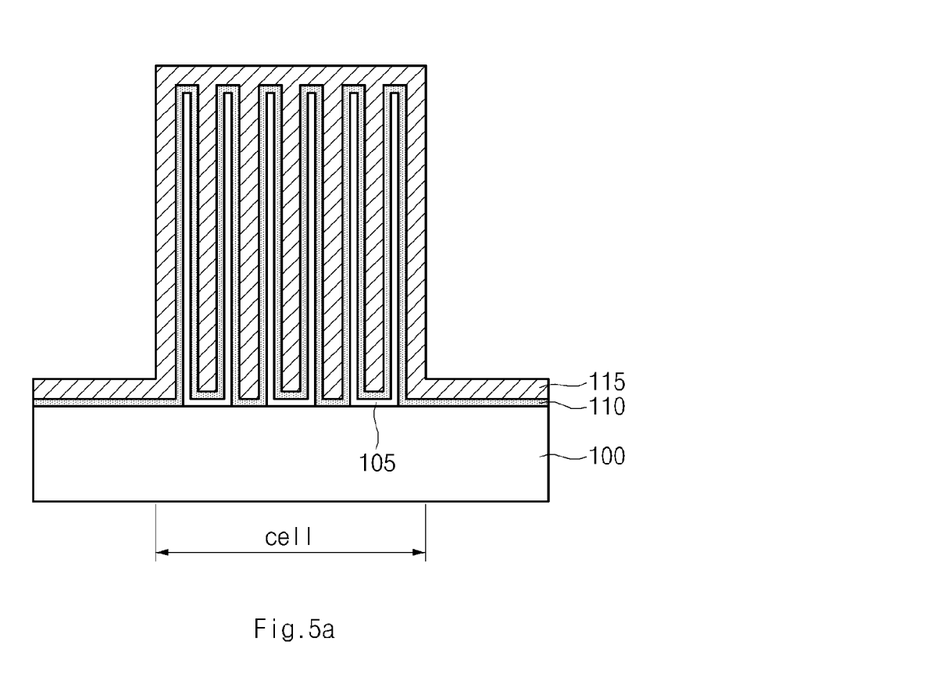
FIG. 5A to 5G are cross-sectional views illustrating a method for forming a semiconductor device according to an embodiment of the present invention.

Referring to FIG. 5A, a sacrificial film (not shown) is formed over the semiconductor substrate 100 in which a lower structure including a storage node contact (not shown) is formed. Preferably, the sacrificial film (not shown) may be formed of a material including an oxide film. Thereafter, a mask pattern (not shown) defining a storage node region is formed over the sacrificial film (not shown). Subsequently, the sacrificial film (not shown) is etched using a mask pattern (not shown) as an etch mask, so that a sacrificial film pattern (not shown) exposing a storage node contact (not shown) is formed.

After that, a conductive material is formed over the semiconductor substrate 100 including the sacrificial film pattern (not shown). In this case, the conductive material may include any one of titanium (Ti), titanium nitride (TiN) and a combination thereof. Thereafter, a planarization process is performed to isolate a conductive material until the sacrificial film pattern (not shown) is exposed, so that a storage node 105 is formed. Subsequently, a sacrificial film (not shown) is removed by a dip-out process.

Thereafter, a dielectric film 110 is formed over the semiconductor substrate 100 including the storage node 105. The dielectric film 110 may be formed of $HfO_2$, $Al_2O_3$, or a combination thereof. Subsequently, a first plate electrode 115 is formed over the dielectric film 110. Preferably, the first plate electrode 115 may be formed of TiN, WN TaN, Pt, Ru, or a combination thereof.

Figure 5B:
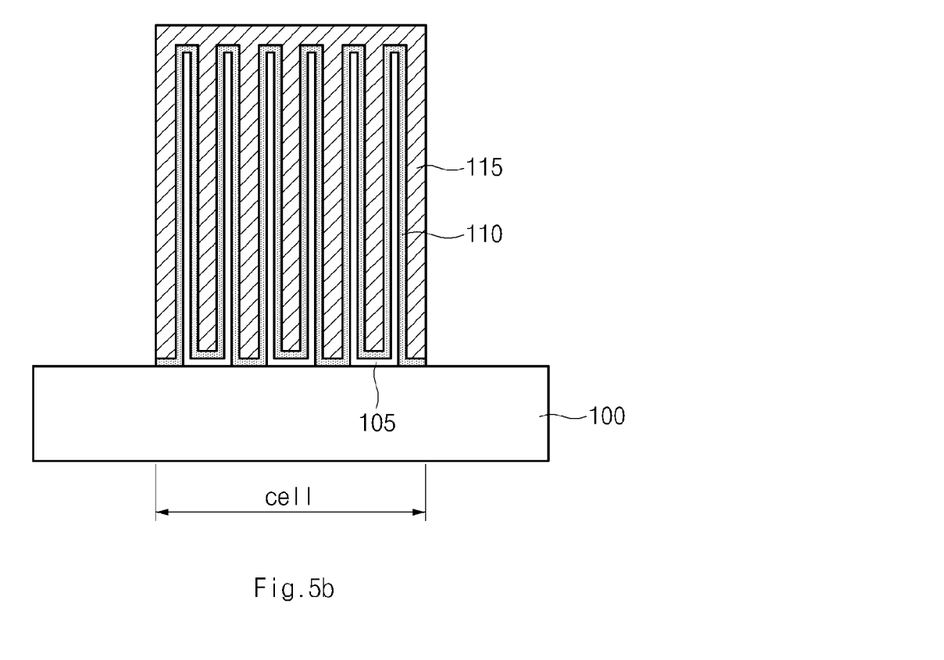
Figure 5C:
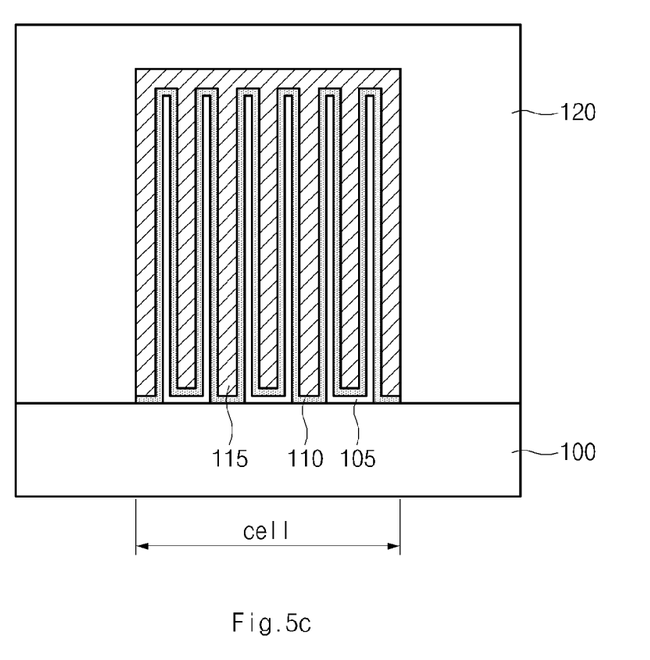

Referring to FIG. 5B, a mask pattern (not shown) is formed over the first plate electrode 115 of the cell region. Then, the first plate electrode 115 formed in the remaining regions other than the cell region is etched using the mask pattern (not shown) as an etch mask. Subsequently, as shown in FIG. 5C, a first insulation film 120 is formed over the semiconductor substrate 100 including the first plate electrode 115. Thereafter, a planarization process is performed to planarize the first insulation film 120.

Figure 5D:
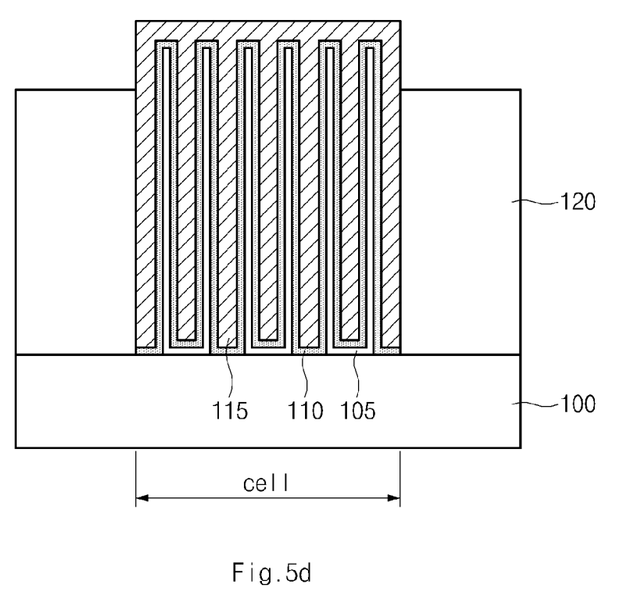
Figure 5E:
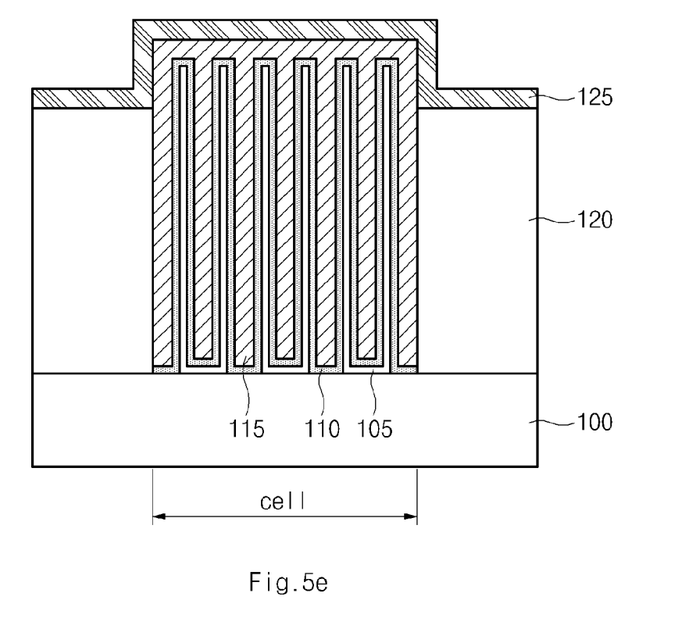

Referring to FIG. 5D, the first insulation film 120 is etched to expose the top surface of the first plate electrode 115. In this etching, the first insulation film 120 may be wet-etched or dry-etched. Subsequently, Referring to FIG. 5E, a second plate electrode 125 is deposited over the exposed first plate electrode 115 and the exposed first insulation film 120. The second plate electrode 125 may be formed of a low-resistance conductive material to reduce resistance of the first plate electrode 115. For example, a material including tungsten (W) may be used as the low-resistance conductive material.

Figure 5F:
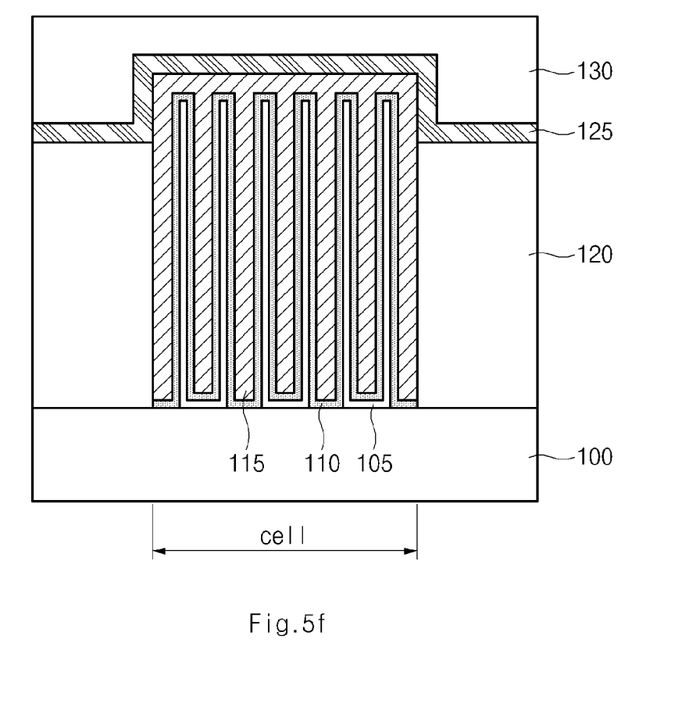
Figure 5G:
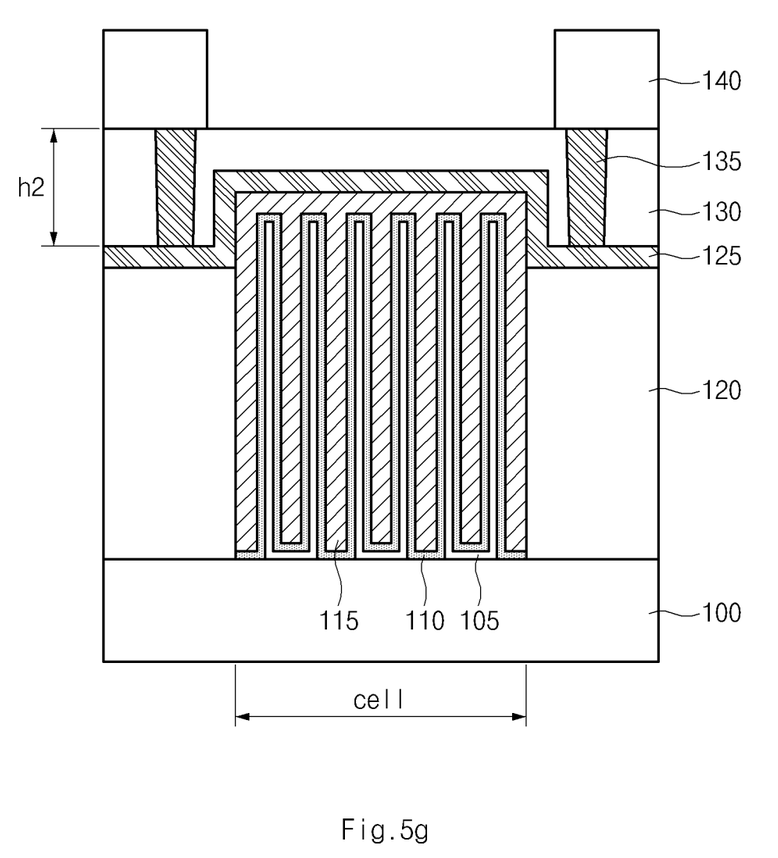

Referring to FIG. 5F, a second insulation film 130 is formed over the second plate electrode 125. Subsequently, a planarization process is performed to planarize the second insulation film 130. Referring to FIG. 5G, the second insulation film 130 is etched to form a contact hole. The contact hole is formed to expose the second plate electrode 125. In this case, a thickness (h2) of the second insulation film 130 to be etched for contact-hole formation is less than a conventional thickness (h1 shown in FIG. 2), resulting in a reduction in the burden of the etch process. Thereafter, a conductive material is buried in the contact hole so that the contact plug 135 is formed. In this case, the depth of the contact plug 135 is less than that of the conventional contact plug, so that an area contacting the plate electrode is increased in size. As a result, since resistance of the plate electrode is reduced, voltage-applying characteristics of the plate electrode are improved, so that device characteristics can be improved.

After a metal layer is formed over the second insulation film 130 in which the contact plug 135 is formed, the resultant metal layer is patterned to be coupled to the contact plug 135, so that the metal line 140 is formed.

As is apparent from the above description, a semiconductor device according to embodiments of the present invention allows a metal contact to be formed closer to a cell region as compared to the related art and greatly reduces the depth of the metal contact, so that the burden of the etch process can be reduced in forming the contact hole. In addition, compared to the related art, a critical dimension (CD) of the metal contact according to an embodiment of the present invention is increased so that a contact area of the metal contact is enlarged and a power source can be more easily applied to the plate electrode, resulting in improved device operation characteristics.

The above embodiment of the present invention is illustrative and not limitative. Various alternatives and equivalents are possible. The invention is not limited by the embodiment described herein. Nor is the invention limited to any specific type of semiconductor device. Other additions, subtractions, or modifications are obvious in view of the present disclosure and are intended to fall within the scope of the appended claims.

What is claimed is:

1. A semiconductor device comprising:
   a plurality of storage nodes formed over a cell region of a semiconductor substrate;
   a first plate electrode disposed over the semiconductor substrate of the cell region including the plurality of storage nodes and separated from the plurality of storage nodes by a dielectric film, the first plate electrode being disposed only in the cell region;
   an insulation film disposed only outside of the cell region over a sidewall of the first plate electrode, wherein an uppermost surface of the insulation film is lower than an uppermost surface of the first plate electrode;
   a second plate electrode disposed over the insulation film and the first plate electrode; and
   a contact plug coupled to the second plate electrode.

2. The semiconductor device according to claim 1, wherein the plurality of storage nodes are cylindrical type storage nodes.

3. The semiconductor device according to claim 1, wherein the plurality of storage nodes include any one of titanium (Ti), titanium nitride (TiN), and a combination thereof.

4. The semiconductor device according to claim 1, wherein the first plate electrode includes any one of TiN, WN, TaN, Pt, Ru, W, and a combination thereof.

5. The semiconductor device according to claim 1, wherein the second plate electrode includes tungsten (W).

6. The semiconductor device according to claim 1, further comprising:
a metal line coupled to the contact plug.

7. The semiconductor device of claim 1, wherein the second plate electrode extends over and is coupled to the first plate electrode.

8. A semiconductor device comprising:
a first plate electrode that is an upper electrode for a plurality of memory cells disposed only over a cell region of a semiconductor substrate;
an insulation film disposed over a sidewall of the first plate electrode, the insulation film being disposed only outside of the cell region;
a second plate electrode disposed over the insulation film and the first plate electrode; and
a contact plug coupled to the second plate electrode.

9. The semiconductor device according to claim 8, further comprising:
a storage node disposed over the cell region of the semiconductor substrate.

10. The semiconductor device according to claim 9, wherein the storage node is configured in a cylindrical form.

11. The semiconductor device according to claim 9, wherein the storage node includes any one of titanium (Ti), titanium nitride (TiN), and a combination thereof.

12. The semiconductor device according to claim 9, further comprising:
a dielectric film disposed over the semiconductor substrate including the storage node.

13. The semiconductor device according to claim 8, wherein an uppermost surface of the insulation film is lower than an uppermost surface of the first plate electrode.

14. The semiconductor device according to claim 8, wherein the first plate electrode includes any one of TiN, WN, TaN, Pt, Ru, W, and a combination thereof.

15. The semiconductor device according to claim 8, wherein the second plate electrode includes any one of TiN, WN, TaN, Pt, Ru, W, and a combination thereof.

16. The semiconductor device according to claim 8, further comprising: a metal line coupled to the contact plug.

17. A semiconductor device, comprising:
a cell region comprising a plurality of cells, each of the cells including a storage node as a lower electrode and a dielectric film disposed over the storage node, and a first plate electrode that extends over the plurality of cells as an upper electrode of the cells, the first plate electrode being disposed only in the cell region;
a first insulation film disposed over sidewalls of the cell region and being disposed only outside of the cell region;
a second plate electrode disposed over the first insulation film and the cell region;
a second insulation film disposed over the second plate electrode; and
a contact plug disposed in the second insulation film outside the cell region and coupled to the second plate electrode.

18. The semiconductor device of claim 17, wherein the second plate electrode extends over and is coupled to the first plate electrode.

19. The semiconductor device of claim 18, wherein a first portion of the second plate electrode is disposed over the plurality of cells at a first level, and a second portion of the second plate electrode which extends outside of the cell region is disposed at a second level below the first level.

* * * * *